United States Patent [19]
Lin et al.

[11] Patent Number: 6,083,828
[45] Date of Patent: Jul. 4, 2000

[54] METHOD FOR FORMING A SELF-ALIGNED CONTACT

[75] Inventors: Kwang-Ming Lin; Russell Chen, both of Hsinchu, Taiwan

[73] Assignee: United Integrated Circuits Corp., Hsinchu, Taiwan

[21] Appl. No.: 09/267,759

[22] Filed: Mar. 11, 1999

[30] Foreign Application Priority Data

Jan. 27, 1999 [TW] Taiwan .................................. 88101194

[51] Int. Cl.[7] .................................................... H01L 21/70
[52] U.S. Cl. ........................ 438/639; 438/618; 438/241; 438/279; 438/199; 438/195; 438/304
[58] Field of Search ...................... 438/639, 657, 438/253, 595, 633, 586, 596, 672, 254, 397, 304, 647, 622, 664, 238; 257/752, 900, 773, 412, 763, 384, 346, 776, 905

[56] References Cited

U.S. PATENT DOCUMENTS

| | | |
|---|---|---|
| 5,166,096 | 11/1992 | Cote et al. ............................... 438/195 |
| 5,599,726 | 2/1997 | Pan ......................................... 438/304 |
| 5,668,024 | 9/1997 | Tsai et al. ............................... 438/199 |
| 5,766,992 | 6/1998 | Chou et al. ............................. 438/241 |
| 5,807,779 | 9/1998 | Liaw ....................................... 438/279 |
| 6,001,726 | 12/1999 | Nagabushnam et al. ............... 438/618 |

*Primary Examiner*—Matthew Smith
*Assistant Examiner*—Igwe Anya
*Attorney, Agent, or Firm*—J.C. Patents; Jiawei Huang

[57] ABSTRACT

A method for forming a SAC opening is provided. As a self-aligned contact (SAC) opening is formed in a dielectric layer on a semiconductor substrate to expose one of source/drain regions in the substrate, a misalignment of the SAC opening may occur to expose a portion of the gate structure. The gate structure has a gate, which is covered by a cap layer on the top, a thin oxide layer on each sidewall of the gate and the cap layer, and a spacer on the thin oxide layer. The SAC opening causes a clearance between the spacer and the gate since a portion of the thin oxide layer is removed. The method contains forming an insulating layer over the substrate to fill the clearance. An etching back process is performed to remove the insulating layer so that a remaining portion of the insulating layer fills the clearance to fully isolate the gate.

18 Claims, 2 Drawing Sheets

METHOD FOR FORMING A SELF-ALIGNED CONTACT

CROSS-REFERENCE TO RELATED APPLICATION

This application claims the priority benefit of Taiwan application serial no. 88101 194, filed Jan. 27, 1999, the full disclosure of which is incorporated herein by reference.

BACKGROUND OF THE INVENTION

1. Field of the Invention

This invention relates to semiconductor fabrication, and more particularly to a method form forming a self-aligned contact (SAC).

2. Description of Related Art

As semiconductor device integration continuously increases, the device dimension is necessary to be accordingly reduced. Thus, a contact opening in the device needs a more precise alignment to prevent an improper electrical coupling to the adjacent device element from occurring as an metallic material is filled into the contact opening. The improper electrical coupling usually causes a short circuit in the device. For example, a contact opening is desired to expose a interchangeable source/drain region but it may also expose a portion of a gate structure if a misalignment occurs. When the misaligned contact opening is filled with metallic material, the interchangeable source/drain and the gate structure are improperly coupled, resulting in a short circuit.

In order to prevent the circuit from occurring, a self-aligned contact technology is developed. A conventional process to form a self-aligned contact (SAC) opening includes forming a cap layer on a gate, which is formed on a semiconductor substrate. A spacer is formed on each sidewall of the gate and the cap layer. A dielectric layer is formed over the substrate, and a contact opening is formed in the dielectric layer. Here, the spacer and the cap layer have to include different insulating material from a material used for forming the contact dielectric layer so as to obtain a proper etching selectivity to only etch the dielectric layer. In this manner, if a misalignment occurs, the contact opening geometrically overlaps with the gate, but the gate is not actually exposed due to protection from the spacer and the cap layer. When a contact plug is formed to fill the contact opening, the short circuit is avoided. This is the main idea of the SAC technology.

Typically, the dielectric layer includes silicon oxide so that the cap layer and the spacer usually include silicon nitride to obtain a desired etching selectivity. In this structure, a stress consequently exits between the spacer made of silicon nitride and the gate, causing a defect of the gate, and further resulting in a current leakage. Conventionally, in order to solve the solve the stress issue, a thin oxide layer is proposed to form in between the spacer and the gate.

However, during the etching, process to form the SAC opening, since the thin oxide layer also includes same material as that of the dielectric layer, a portion of the thin oxide layer is simultaneously etched. Moreover, some native oxide after the etching process remains in the etched portion of the thin oxide layer. The native oxide is cleaned by rinsing with HF acid solution, which may further remove a portion of the thin oxide layer. As a result, a clearance occurs between the gate and the spacer, in which the clearance exposes a portion of the gate within the SAC opening. When metallic material is filled into the SAC opening, a short circuit occurs again, even though the opening is formed by the SAC technology.

SUMMARY OF THE INVENTION

It is therefore an objective of the present invention to provide a method for forming a SAC opening so as to avoid a short circuit due to a clearance between a spacer and a gate.

In accordance with the foregoing and other objectives of the present invention, an improved method for forming a SAC opening is provided. As a SAC opening is formed in a dielectric layer on a semiconductor substrate to expose one of source/drain regions in the substrate, misalignment of the SAC opening may occur to expose a portion of the gate structure. The gate structure includes a gate and a gate oxide layer, which are covered by a cap layer oil the top, a thin oxide layer on each sidewall of the gate and the cap layer, and a spacer on the thin oxide layer. The SAC opening causes a clearance between the spacer and the gate since a portion of the thin oxide layer is removed. The improved method includes forming an insulating layer over the substrate to fill the clearance. An etching back process is performed to remove the insulating layer so that a remaining portion of the insulating layer fills the clearance to fully isolate the gate. In this manner, when a conductive contact plug is formed to fill the SAC opening, a conventional short circuit issue between the gate and the junction region of source or drain is avoided.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

The conventional process to form a self-aligned contact (SAC) opening has a short circuit issue due to a clearance between a spacer and a gate. The invention introduces an additional process to fill the clearance with insulating material so as to fully isolate the gate. There is no short circuit occurring in the invention. Detail descriptions, according to the invention, are following.

Figure 1A:
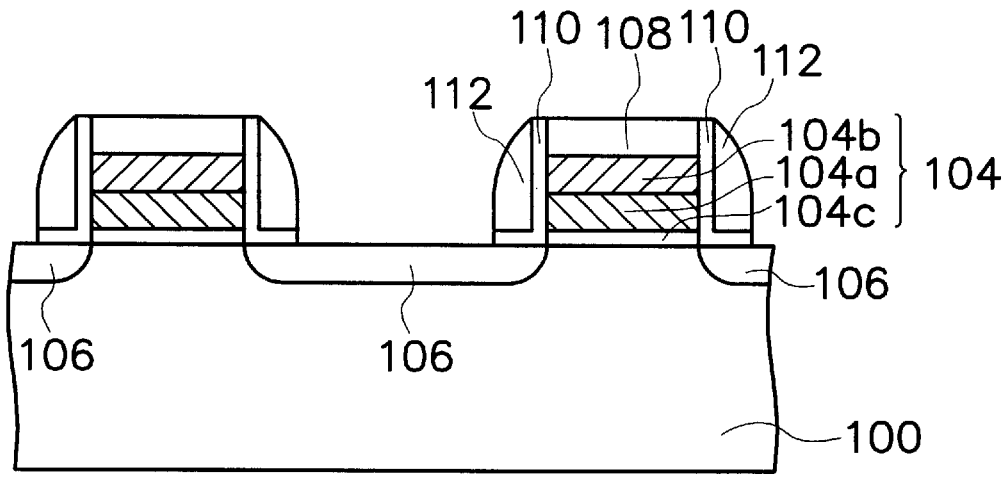
FIGS. 1A–1D are cross-sectional view of a portion of a substrate, schematically illustrating a fabrication process to form a self-aligned contact opening to expose an interchangeable source/drain region.

FIGS. 1A–1D are cross-sectional view of a portion of a substrate, schematically illustrating a fabrication process to form a self-aligned contact opening to expose an interchangeable source/drain region. In FIG. 1A, a gate structure 104 is formed on a semiconductor substrate 100, and a junction region 106, which is a source region or a drain region. The gate structure 104 further includes a gate oxide layer 104c, a polysilicon layer 104a, and a metal silicide layer 104b. A cap layer 108 including, for example, silicon nitride is formed on the gate structure 104. A liner oxide layer 110 and a spacer 112 are formed on each sidewall of the gate structure 104 and the cap layer 108, in which the liner oxide layer 110 between the spacer 112 and the gate structure 104 is used to reduce a stress between the spacer 112 and the gate structure 104. The spacer 112 includes, for example, silicon nitride. The liner oxide layer 110 includes, for example, silicon oxide. Generally, the cap layer 108 and the spacer 112 include an insulating material, which is different from a dielectric material used for forming a dielectric layer later. The purpose to choose difference materials is to obtain a proper etching selectivity relative to the spacer 112 and the cap layer 108.

The formation of the liner oxide layer 112 includes performing a low pressure chemical vapor deposition (LPCVD) with a reaction gas of tetra-ethyl-ortho-silicate (TEOS) to form a conformal oxide layer. A silicon nitride layer is formed on the oxide layer. An etching back process is performed to remove the oxide layer and the silicon nitride layer so that a remaining portion forms the spacer 112 and the liner oxide layer 110.

Figure 1B:
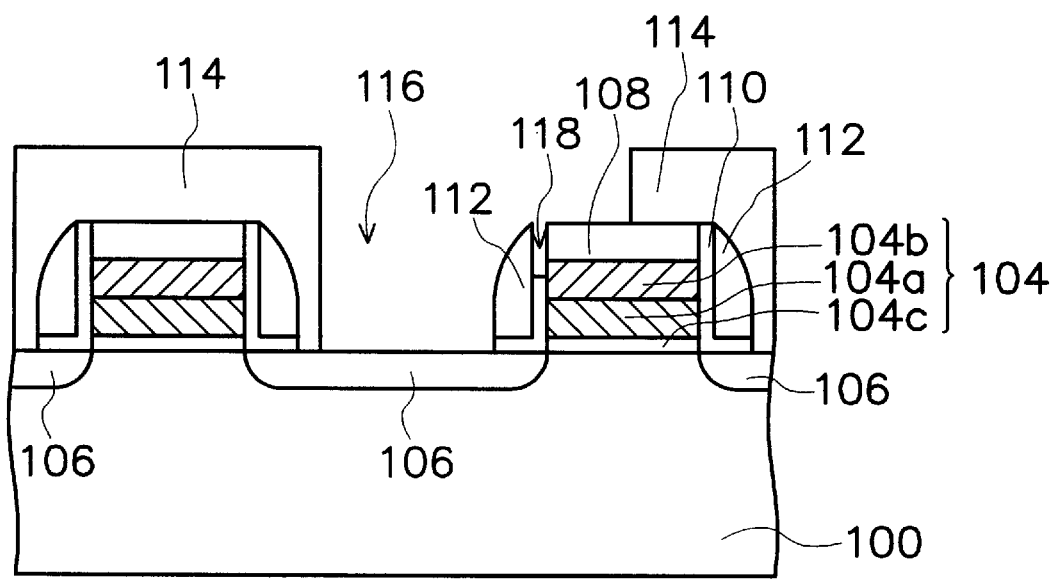

In FIG. 1B, a dielectric layer 114 including, for example, silicon oxide is formed over the substrate 100. A contact opening 116 is formed in the dielectric layer 114 to expose the junction region 106 through, for example, photolithography and etching. Since the contact opening 116 is formed by the SAC technology, the contact opening 116 may be misalignied to expose the cap layer 108, the liner oxide layer 110, and the spacer 112. Since a proper etching selectivity is arranged by proper choosing insulating materials, the cap layer 108 and the spacer 112 is not etched, but since the liner oxide layer 110 and the dielectric layer 114 have similar etching property, a portion of the liner oxide layer 112 is removed to form a clearance 118. After the etching process, some native oxide (not shown) still exits on the substrate 100. In order to remove the native oxide, it is rinsed by, for example, HF acid solution. The HF acid solution can clean the native oxide and may also further remove the liner oxide layer 112 to cause an increase of the clearance 118. As a result, the clearance 118 may expose the gate structure 104 again.

If a metallization process is performed at this stage to form a metal contact plug in the contact opening 116, a short circuit between the junction region 106 and the gate structure 104 occurs again, even through the contact opening 116 is formed by SAC technology. This is the conventional issue. In order to solve the issue, a solution is introduced.

Figure 1C:
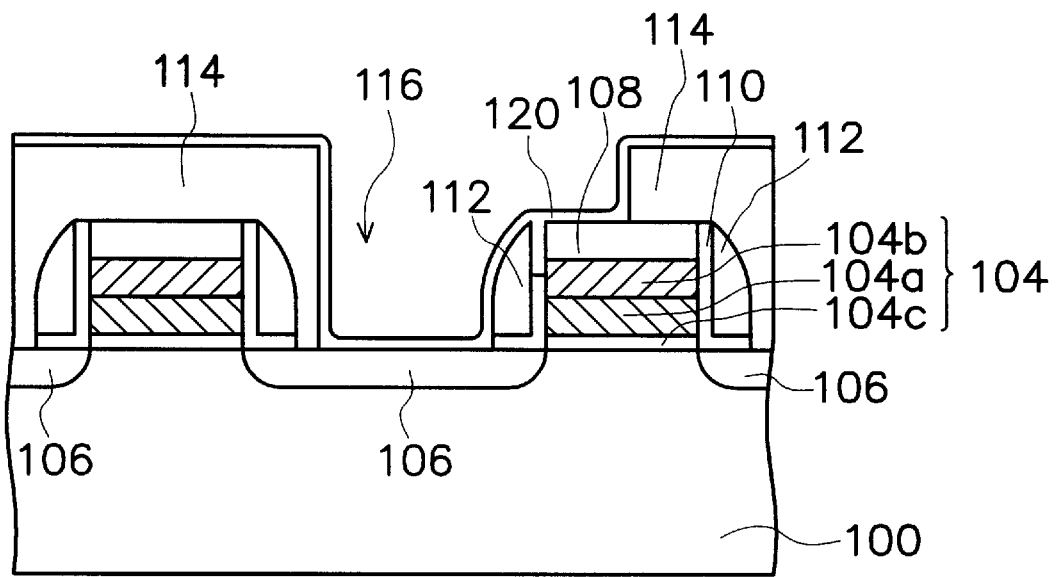

In FIG. 1C, an insulating layer 120 is formed over the substrate, in which the clearance 118 of FIG. 1B is filled by the insulating layer 120 also. The insulating layer 120 includes, for example, silicon nitride or silicon oxynitride and is formed by, for example, plasma enhance chemical vapor deposition (PECVD) or LPCVD. The thickness of the insulating layer 120 is about 50 Å–500 Å.

Figure 1D:
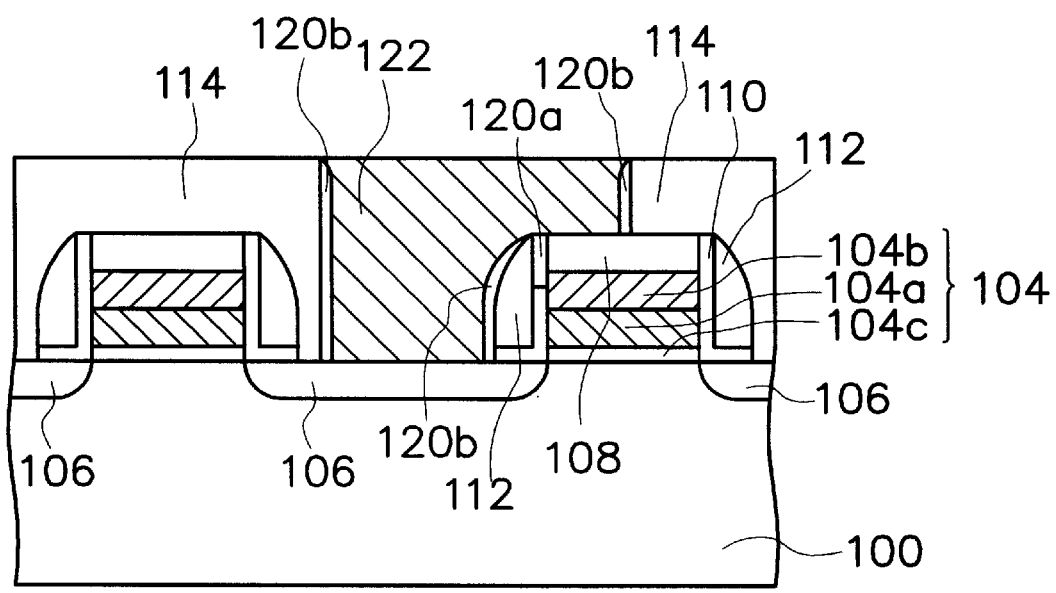

In FIG. 1D, an etching back process, such as an anisotropic etching, is performed to remove the insulating layer 120 so that a remaining portion of the insulating layer 120 forms an insulating space 120a to fill the clearance 118 of FIG 1B, and an insulating spacer 120b on each side wall of the contact opening 116 and the outer surface of the spacer 112. The gate structure 104 is fully isolated due to the spacer 120a. A rinsing process with HF acid solution is performed to clean native oxide on the substrate 100. Since the clearance 118 is filled by the spacer 120a, the gate structure 104 is not exposed.

Continuously, a contact plug 122 is formed to fill the contact opening 116. The formation of the contact plug 122 includes depositing a conductive (not shown) layer over the substrate 100 to fill the contact opening 116, performing an etching back process to remove the conductive layer until the dielectric layer 114 is exposed. The conductive layer include, for example, metallic material. A remaining portion of the conductive layer forms a conductive contact plug 122 to fill the contact opening 116. There is no short circuit occurring between the conductive contact plug 122 and the gate structure 104.

An experiment is performed by applying a bias $V_{bd}$ between the conductive contact plug and the gate structure 104. Experimental results show that the bias $V_{bd}$ can go up to about 12.4V–12.6V without a current being induced. This means that the gate structure 104 has a sufficiently good isolation from the conductive contact plug 122. The advantages of the SAC opening are maintained to have its essential applications in reducing device dimension.

In conclusion, the insulating layer 120 in the invention is formed to fill the clearance 118 so as to obtain a sufficiently good isolation on the gate structure 104. The property of the SAC contact opening 116 is maintained so that its essential applications in reducing device dimension are maintained.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for forming a self-aligned contact (SAC), the method suitable for a gate structure that is formed on a semiconductor substrate and is covered by a cap layer on the top, a liner oxide layer on each sidewall of both the gate and the cap layer, and a spacer on the liner oxide layer, in which an interchangeable source/drain region is formed in the substrate at each side of the gate structure, the method comprising:

forming a dielectric layer over the substrate;

patterning the dielectric layer to form a SAC opening, which exposes the interchangeable source/drain region and may expose the cap layer, the liner layer, and the spacer, due to a misalignment property of the SAC opening, wherein since the liner layer is exposed, a portion of the liner layer is also removed to leave a clearance that exposes the gate structure;

forming an insulating plug to fill the clearance so as to isolate the gate structure; and forming a SAC conductive plug to fill the SAC opening so as to form the SAC contact.

2. The method of claim 1, wherein the step of forming the insulating plug to fill the clearance further comprises:

forming an insulating layer over the substrate to at least fill the clearance; and performing an etching back process to remove the insulating layer so that a remaining portion of the insulating layer at least form the insulating plug to fill the clearance so as to isolate the gate structure.

3. The method of claim 2, wherein the step of forming the insulating layer comprises low pressure chemical vapor deposition (LPCVD).

4. The method of claim 2, wherein the step of forming the insulating layer comprises plasma enhanced chemical vapor deposition (PECVD).

5. The method of claim 2, wherein the step of performing the etching back process to remove the insulating layer comprises an anisotropic process.

6. The method of claim 2, wherein the insulating layer comprises a thickness of about 50 Å–500 Å.

7. The method of claim 1, wherein the dielectric layer comprises silicon oxide.

8. The method of claim 1, wherein the insulating plug comprises silicon nitride.

9. The method of claim 1, wherein the insulating plug comprises silicon oxynitride.

10. The method of claim 1, wherein the spacer and the cap layer comprise silicon nitride.

11. The method of claim 1, wherein a formation of the gate structure comprises sequentially forming a gate oxide layer, a polysilicon layer, and a metal silicide layer on the substrate.

12. A method of protecting a gate structure, which is formed on a semiconductor substrate and is covered by a cap layer on the top, a liner oxide layer on each sidewall of both the gate and the cap layer, and a spacer on the liner oxide layer, in which an interchangeable source/drain region is formed in the substrate at each side of the gate structure, wherein a dielectric layer is formed over the substrate with a contact opening to expose the interchangeable source/drain region and the gate structure at a clearance between the spacer and the gate structure, which clearance is originally occupied by a portion of the liner oxide layer but is removed during a formation of the contact opening, the method comprising:

forming an insulating layer over the substrate to fill the clearance; and performing an etching back process to remove the insulating layer so that a remaining portion of the insulating layer form an insulating plug to fill the clearance so as to fully isolate the gate structure.

13. The method of claim 12, wherein the step of forming the insulating layer comprises low pressure chemical vapor deposition (LPCVD).

14. The method of claim 12, wherein the step of forming the insulating layer comprises plasma enhanced chemical vapor deposition (PECVD).

15. The method of claim 12, wherein the step of performing the etching back process to remove the insulating layer comprises an anisotropic process.

16. The method of claim 12, wherein the insulating layer comprises a thickness of about 50 Å–500 Å.

17. The method of claim 12, wherein the insulating layer comprises silicon nitride.

18. The method of claim 12, wherein the insulating layer comprises silicon oxynitride.

* * * * *